(12) United States Patent
Guo et al.

(10) Patent No.: US 7,806,641 B2
(45) Date of Patent: Oct. 5, 2010

(54) SUBSTRATE PROCESSING SYSTEM HAVING IMPROVED SUBSTRATE TRANSPORT SYSTEM

(75) Inventors: George X. Guo, Palo Alto, CA (US); Kai-an Wang, Cupertino, CA (US)

(73) Assignee: Ascentool, Inc., Cupertino, CA (US)

( * ) Notice: Subject to any disclaimer, the term of this patent is extended or adjusted under 35 U.S.C. 154(b) by 486 days.

(21) Appl. No.: 11/847,956

(22) Filed: Aug. 30, 2007

(65) Prior Publication Data

US 2009/0060689 A1 Mar. 5, 2009

(51) Int. Cl.
*H01L 21/677* (2006.01)
(52) U.S. Cl. ..................................... 414/217
(58) Field of Classification Search ............. 414/217, 414/217.1
See application file for complete search history.

(56) References Cited

U.S. PATENT DOCUMENTS

| 6,818,108 | B2 | 11/2004 | Schertler |
| 2005/0058776 | A1 | 3/2005 | Parent |
| 2006/0177288 | A1* | 8/2006 | Parker et al. ................ 414/217 |
| 2006/0251814 | A1 | 11/2006 | Parent |
| 2006/0283391 | A1 | 12/2006 | Parent |

* cited by examiner

*Primary Examiner*—Gregory W Adams
*Assistant Examiner*—Joshua I Rudawitz
(74) *Attorney, Agent, or Firm*—Xin Wen

(57) ABSTRACT

A substrate processing system includes a first load lock, a process chamber having a first opening to allow an exchange of a substrate between the first load lock and the first process chamber, first rollers in the process chamber; and second rollers in the first load lock, wherein the first rollers and the second rollers are configured to transport a substrate thereon through the first opening between the first load lock and the process chamber. The first rollers and the second rollers are not rotated by an active transport mechanism.

22 Claims, 15 Drawing Sheets

SUBSTRATE PROCESSING SYSTEM HAVING IMPROVED SUBSTRATE TRANSPORT SYSTEM

TECHNICAL FIELD

This application relates to an apparatus for depositing material on a substrate, etching substrate, and thermal processing in a vacuum or reduced pressure environment.

BACKGROUND

Material deposition and other substrate processing are widely used in window glass coating, flat panel display manufacturing, coating on flexible films (such as webs), hard disk coating, industrial surface coating, semiconductor wafer processing, photovoltaic panels, and other applications. Materials are sputtered off a target or vaporized from a source and deposited on a substrate. Materials can also be deposited by chemical vapor deposition method. A deposition process may include the following steps: a substrate can be placed in the process chamber. The chamber is evacuated and back filled with a desirable gas. The deposition is carried out. The process chamber can be vented before the substrate is taken out. The evacuation of the process chamber can take much time and limit the throughput of the deposition system. In addition, residues of the atmosphere or reaction with atmosphere can also affect the quality of deposited material.

To address the issues of throughput and environment control, one can employ a load lock in connection with a processing chamber. A substrate can be loaded in the load lock in an atmospheric environment. The load lock is then evacuated to vacuum or to reach conditions similar to the process chamber. The substrate is then transported by a transport mechanism into the process chamber to conduct processing steps such as cleaning, etching, and deposition. The substrate is then removed from the process chamber to the load lock. Commercial vacuum processing equipment can include the following types: single load lock and single process chamber, in-line system with one load lock at each end of the system, cluster tool with one or more central substrate transfer modules. The single load lock and single process chamber system requires an active transportation mechanism to carry entire substrate over a long distance without mechanical support and can not carry heavy substrate. In addition, most single load lock and single process chamber system can only load one substrate at a time and have limited throughput. The in-line system requires two load locks and an active transport system either inside vacuum or through the vacuum envelope. The cluster tool requires one or more large central transfer modules to actively transport the work pieces. When several process chambers are present, the transport mechanism is required to move the work pieces between various process stations. The transport mechanism is required not to introduce gas or air to the vacuum or controlled environment. The transport mechanism can use low power and low out-gassing vacuum motors, or use bellows or seals to transfer motion from outside the vacuum. The typical moving mechanism carries the entire substrate and typically requires heavy and expensive mechanism. The seals or bellows have limited lifetime and are also expensive. The active motors require constant monitoring and are a major cause of failures. The complexity of the aforementioned active transport mechanisms increases the system cost and reduces reliability.

Therefore there is a need for a simple and reliable system for deposition or other vacuum processing operations having desired throughput and deposition quality.

SUMMARY

In one aspect, the present invention relates to a substrate processing system that includes a first load lock, a process chamber having a first opening to allow an exchange of a substrate between the first load lock and the first process chamber, first rollers in the process chamber; and second rollers in the first load lock, wherein the first rollers and the second rollers are configured to transport a substrate thereon through the first opening between the first load lock and the process chamber, wherein the first rollers and the second rollers are not rotated by an active transport mechanism.

In another aspect, the present invention relates to a substrate processing system that includes a first load lock; a process chamber having a first opening to allow an exchange of a substrate between the first load lock and the first process chamber; first rollers in the process chamber; a first stack of second rollers in the first load lock; and a second stack of second rollers in the first load lock, wherein the second stack of second rollers are at a different height from the first stack of rollers, wherein the first rollers and the first stack of the second rollers are configured to transport a first substrate thereon through the first opening between the first load lock and the process chamber, and wherein the first rollers and the second stack of the second rollers are configured to transport a second substrate thereon through the first opening between the first load lock and the process chamber.

In another aspect, the present invention relates to a substrate processing system that includes a first load lock; a first process chamber having a first opening to allow an exchange of a substrate between the first load lock and the first process chamber; a second process chamber having a second opening to allow an exchange of the substrate between the first process chamber and the second process chamber; a second load lock having a second opening to allow an exchange of the substrate between the second load lock and the second process chamber; first rollers in the first load lock; second roller in the first process chamber, wherein the first rollers and the second rollers are configured to transport the substrate thereon through the first opening between the first load lock and the first process chamber; third roller in the second process chamber, wherein the second rollers and the third rollers are configured to transport the substrate thereon through the second opening between the first process chamber and the second process chamber; and fourth rollers in the second load lock, wherein the third rollers and the fourth rollers are configured to transport the substrate thereon through the third opening between the second process chamber and the second load lock, wherein the first rollers, the second rollers, the third rollers, and the fourth rollers are not rotated by an active transport mechanism.

The method includes Implementations of the system may include one or more of the following. The first rollers and the second rollers can transport the substrate substantially within a plane. The second rollers can include a first stack of rollers and a second stack of rollers at a different height from the first stack of rollers. The substrate processing system can further include a first transport mechanism configured to move the first stack of rollers to substantially the same height as the first rollers, wherein the first rollers and the first stack of rollers are configured to transport the substrate substantially through the first opening between the first load lock and the process chamber. The first transport mechanism can include move the second stack of rollers to substantially the same height as the first rollers, and wherein the first rollers and the second stack of rollers are configured transport the substrate substantially through the first opening between the first load lock and the process chamber. The substrate processing system can further include a second transport mechanism configured to move the substrate on the first rollers and the second rollers. The second transport mechanism can include push and pull the substrate on the first rollers and at least a portion of the second rollers. At least one of the first load lock and the process chamber can tilt to allow the substrate to move under gravitation on the first rollers and the second rollers. The tilt angle can be below 33 degree relative to the horizontal direction. The tilt angle can be between 1 degree and 10 degrees relative to the horizontal direction. At least one of the first load lock and the process chamber can tilt to a first tilt angle to allow the substrate to move under gravitation on the first rollers and the second rollers from the first load lock to the process chamber, and wherein at least one of the first load lock and the process chamber is configured to tilt to a second tilt angle to allow the substrate to move under gravitation on the first rollers and the second rollers from the process chamber to the first load lock. The process chamber can include at least one deposition source configured to provide a material to be deposited on the substrate. The first load lock can include at least one deposition source configured to provide a material to be deposited on the substrate. The substrate processing system can further include a gate configured to close the first opening to isolate the interior of the first process chamber from the interior of the first load lock. The first load lock can include an opening through which the substrate is loaded into the first load lock therein or unloaded from the first load lock therein. The substrate processing system can further include a second load lock configured to connect with the process chamber through a second opening in the chamber wall; and third rollers in the second load lock, wherein the second rollers and the third rollers are configured to transport a substrate thereon through the second opening between the second load lock and the process chamber. The first load lock and the second load lock can be disposed on opposite sides of the process chamber. The second rollers can include a first stack of rollers and a second stack of rollers at a different height from the first stack of rollers. The first load lock, the process chamber, and the second load lock can be configured to tilt to allow the substrate to move under gravitation on at least one of the first rollers, the second rollers, and the third rollers.

Embodiments may include one or more of the following advantages. The disclosed systems and methods can reduce system complexity and manufacturing cost comparing to some convention systems. For example, a single load lock chamber can continuously feed the process chamber with substrates without delay. A substrate in the process chamber in the disclosed substrate processing system can be transported on rollers by a small force or by gravitation applied to the substrate. The rollers are rotated by the movement of the substrate instead of being directly driven by a heavy and complex motorized transport mechanism (e.g. active transport mechanism) as in some conventional systems. The removal of such active transport systems for the substrates can also reduce the size and footprint of the substrate processing systems.

Another advantage of the disclosed system is that the substrate mechanism is more reliable compared to some conventional systems that include bellows or sealing components which are prune to failures. The substrate carried by rollers can reliably be moved by a small force or by gravitation in the disclosed substrate processing system.

Another advantage of the disclosed system is that the contamination related to motorized mechanisms in some conventional systems can be reduced or eliminated by using a cleaner gravity driven transport mechanism for the substrates.

The disclosed systems and methods can also improve throughput by using a continuous workflow between an input load lock and an output load lock.

The details of one or more embodiments are set forth in the accompanying drawings and in the description below. Other features, objects, and advantages of the invention will become apparent from the description and drawings, and from the claims.

DETAILED DESCRIPTION

Figure 1A:
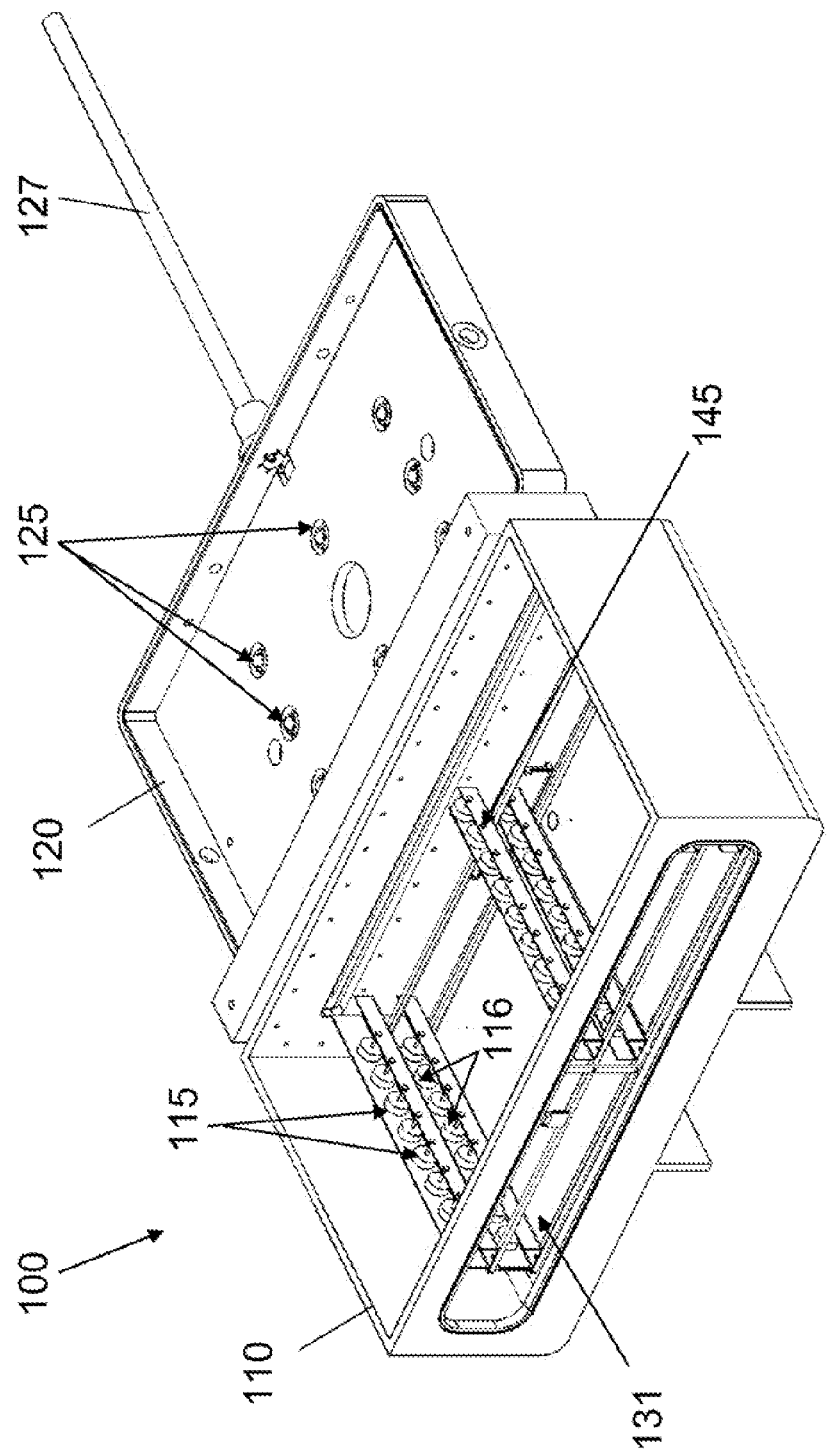
FIG. 1A is a perspective view of a substrate processing system having an improved substrate transport system and a process chamber.
Figure 1B:
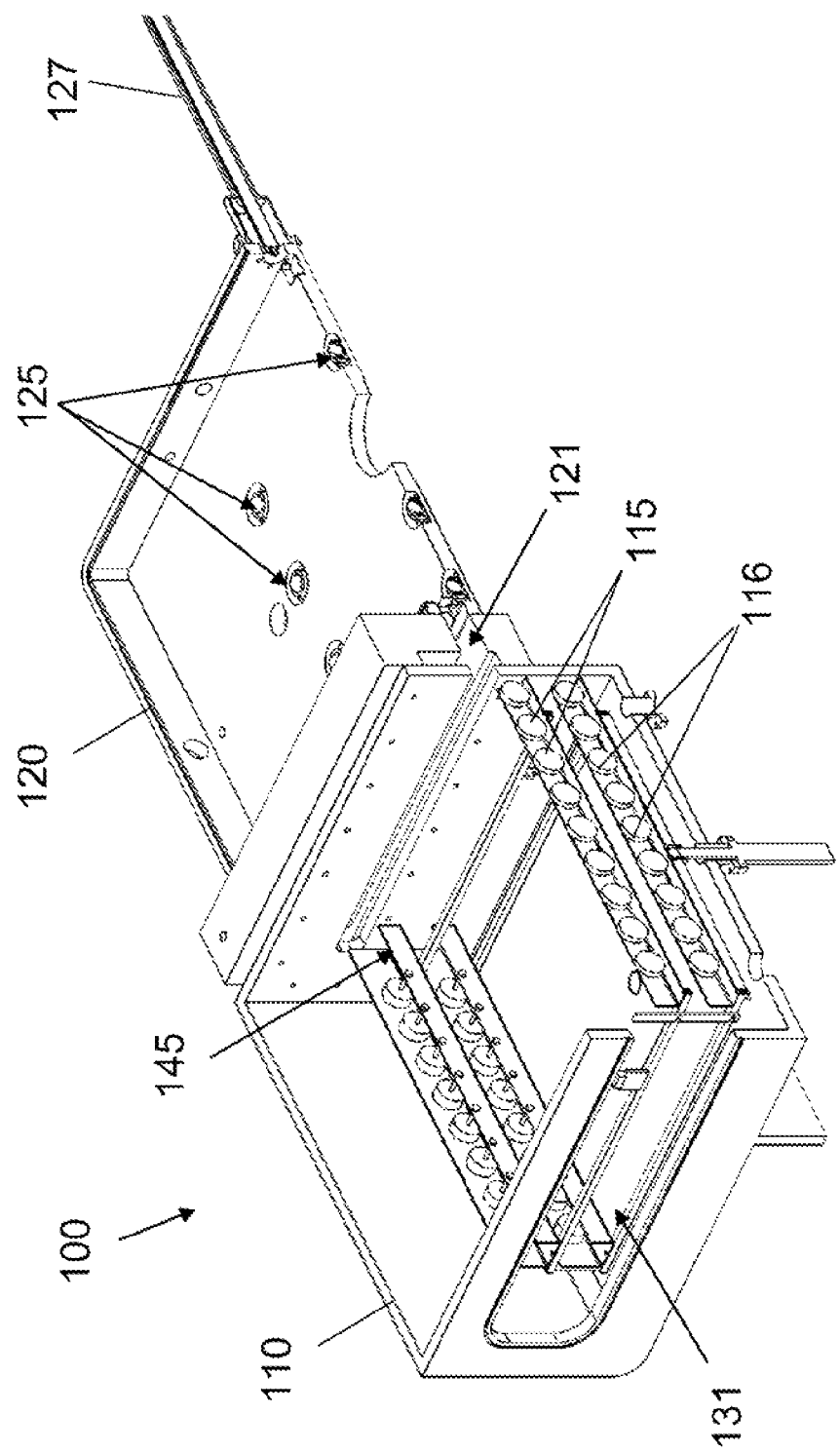
FIG. 1B is a cross-sectional perspective view of the improved substrate transport system of FIG. 1A.
Figure 1C:
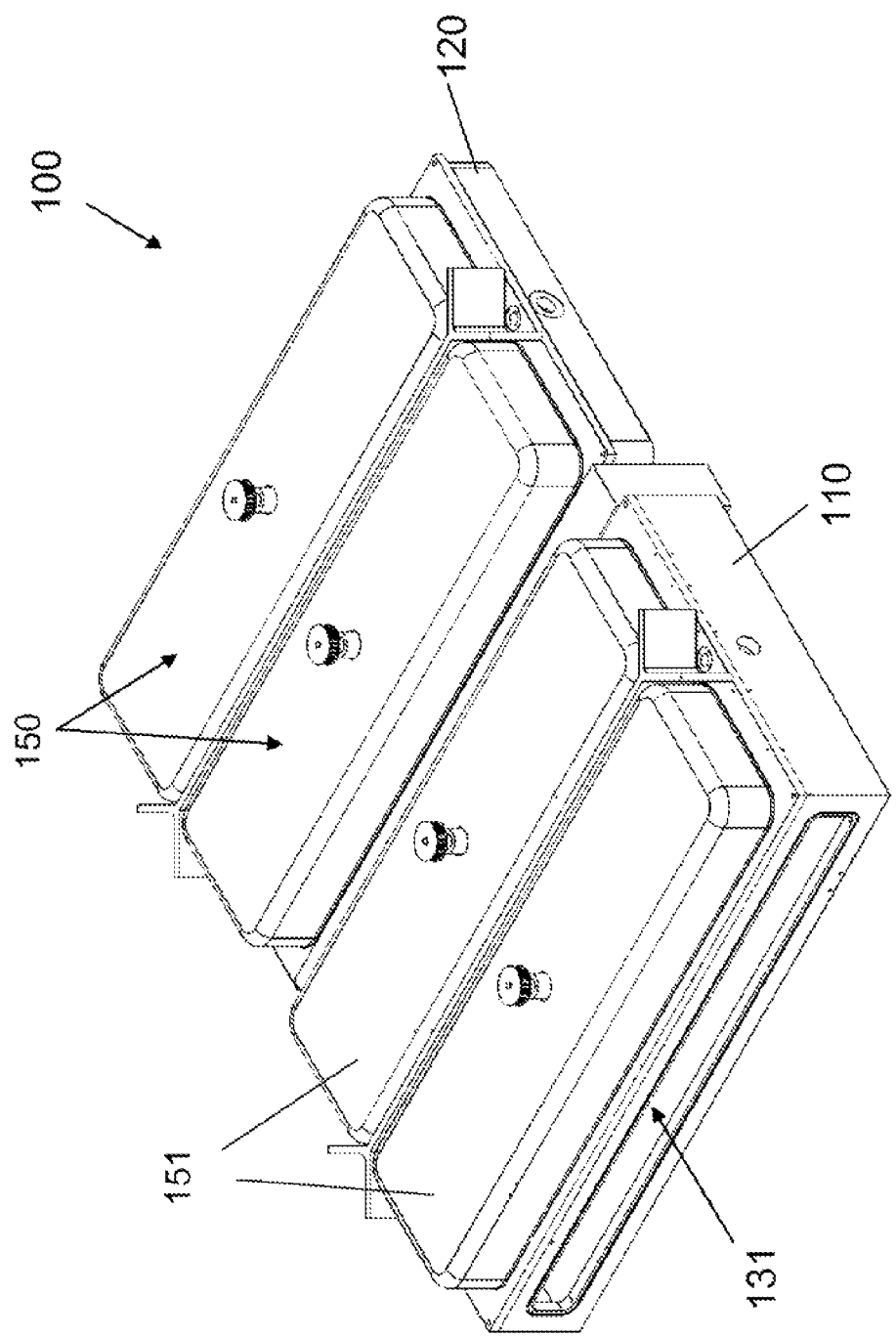
FIG. 1C is a perspective view of the substrate processing system of FIG. 1A with deposition sources or other processing sources installed in load lock and process chamber.
Figure 1D:
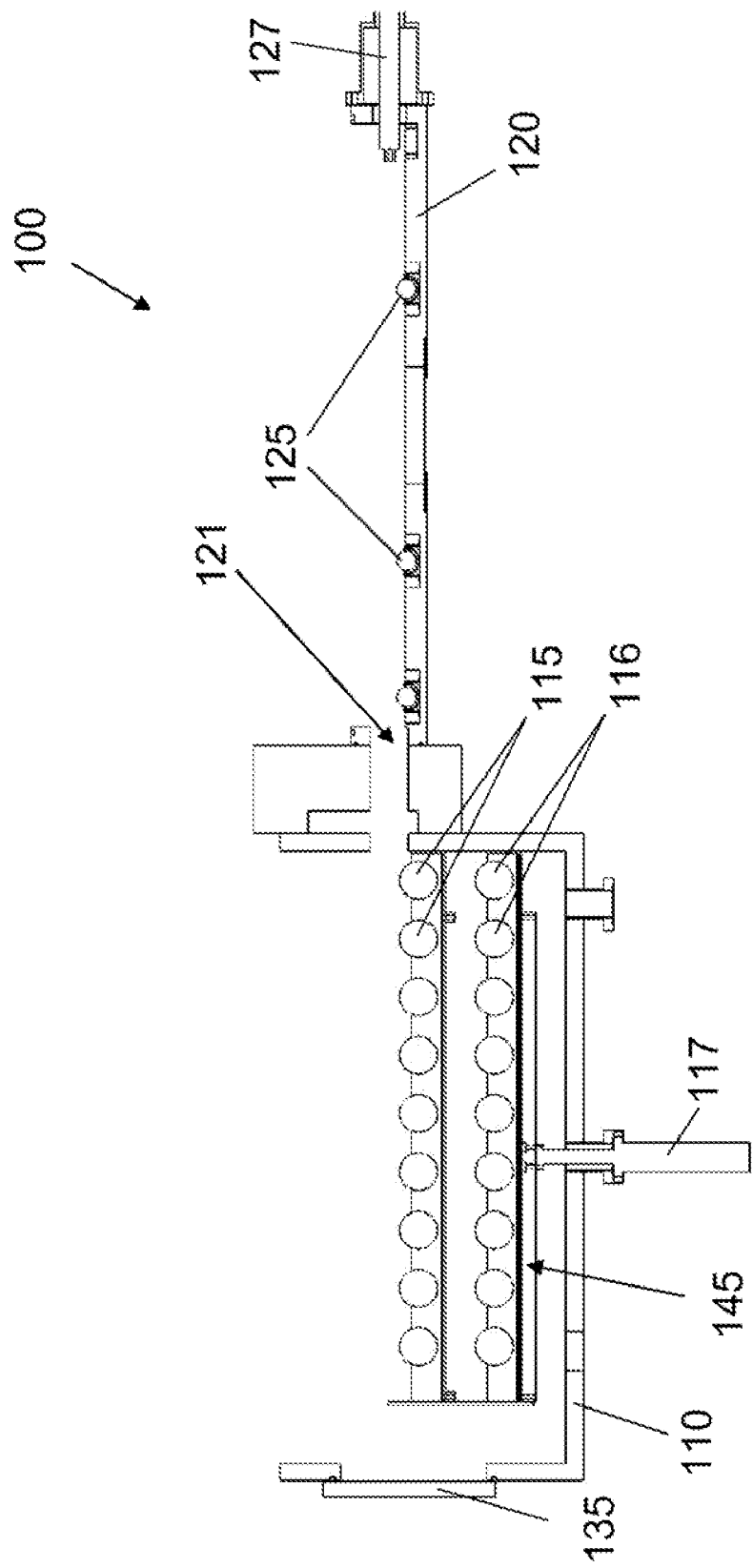
FIG. 1D is a side cross-sectional view of the substrate processing system having the improved substrate transport system of FIG. 1A.

Referring to FIGS. 1A-1K, a substrate processing system 100 includes a load lock 110 and a process chamber 120. The process chamber 120 can be evacuated during material deposition and other processing steps such as cleaning, etching etc. The substrate processing system 100 can also include sources 150 for providing materials to be deposited or processed on a substrate 140, 141. The process chamber 120 can include proper electrodes for establishing DC or AC voltages between the substrate and the other components in the process chamber 120 (e.g. the chamber wall or a backing plate on the target). A vacuum pump can be connected to the process chamber 120 to produce a vacuum environment around the substrate 140, 141 during processing operations. The sources 150 can include one or more targets and one or more magnetron sources. The sources 150 can also be shower head for distributing chemicals, ion source for substrate cleaning, heating or cooling source. The interiors of the load lock 110 can be connected to the interior of the process chamber 120 by openings 121. The opening 121 can be closed to isolate the interiors of the load lock 110 from the interior of the process chamber 120 by an isolation valve 122. The load lock 110 can optionally include a source 151 for deposition or other processing operations.

A transport system for transporting a substrate 140, 141 can include a plurality of rollers 125 mounted in the process chamber 120, and a plurality of rollers 115 and 116 mounted in the load lock 110. A substrate 140, 141 can be placed on the rollers 115 and 116 or the rollers 125 and held down the rollers by gravity, magnetic forces, or mechanical stopper near edge of the substrate. The substrate 140, 141 placed on the rollers 115, 125, 126 can be moved by a tilt in the process chamber 120 or the load lock 110 (as described in relation to FIG. 2-3B below). The substrate 140, 141 placed on the rollers 115, 125, 126 can also be moved by a push or a pull by a mechanism 127 (as described below). The mechanism 127 can be either motorized or manually operated by an operator. The force required to move substrate 140 and 141 is small and the mechanism 127 can also be supported by rollers 125, the mechanism 127 is therefore simpler and more reliable than conventional substrate transfer mechanism. The substrate 140, 141 can be guided by a guard rail during the movement. In the present specification, the term "roller" is used to refer to a mechanism that can rotate and allow a substrate to move thereon. A "roller" can include a roller, a ball that can rotate freely, a wheel, and other mechanisms. It should be noted that the rollers in the disclose system are not rotated by an active transport mechanism such as motors or motor driven conveyance belt as used in some conventional systems. The rollers can be rotated passively by the movement of the substrate that is placed on the rollers.

The load lock 110 can include an opening 131 for loading and unloading substrates. A door 135 can seal the opening 131 to keep the load lock 110 in a vacuum environment. The load lock 110 can include multiple stacks of rollers 115 and 116 mounted on a rack 145, which each can be used to carry and transport a different substrate 140 or 141. A multiple of substrates 140 and 141 can therefore be simultaneously held in the load lock 110, loaded or unloaded while another substrate is being processed in the process chamber 120. The load lock 110 can include a transport mechanism 117 that can move the stacks of rollers 115 and 116 in a direction 118 such that the top surface the stack of rollers 115 or the stack of rollers 116 can be registered to the top surface of the rollers 125. A substrate 140 or 141 can therefore move substantially in planar fashion from the rollers 125 to the stack of rollers 115 or vice versa. The mechanism 117 can also adjust the height of the rollers 116 to be in registration to the rollers 125 such that a substrate 140 or 141 move substantially in a plane from the rollers 125 to the stack of rollers 116 or vice versa.

Figure 1E:
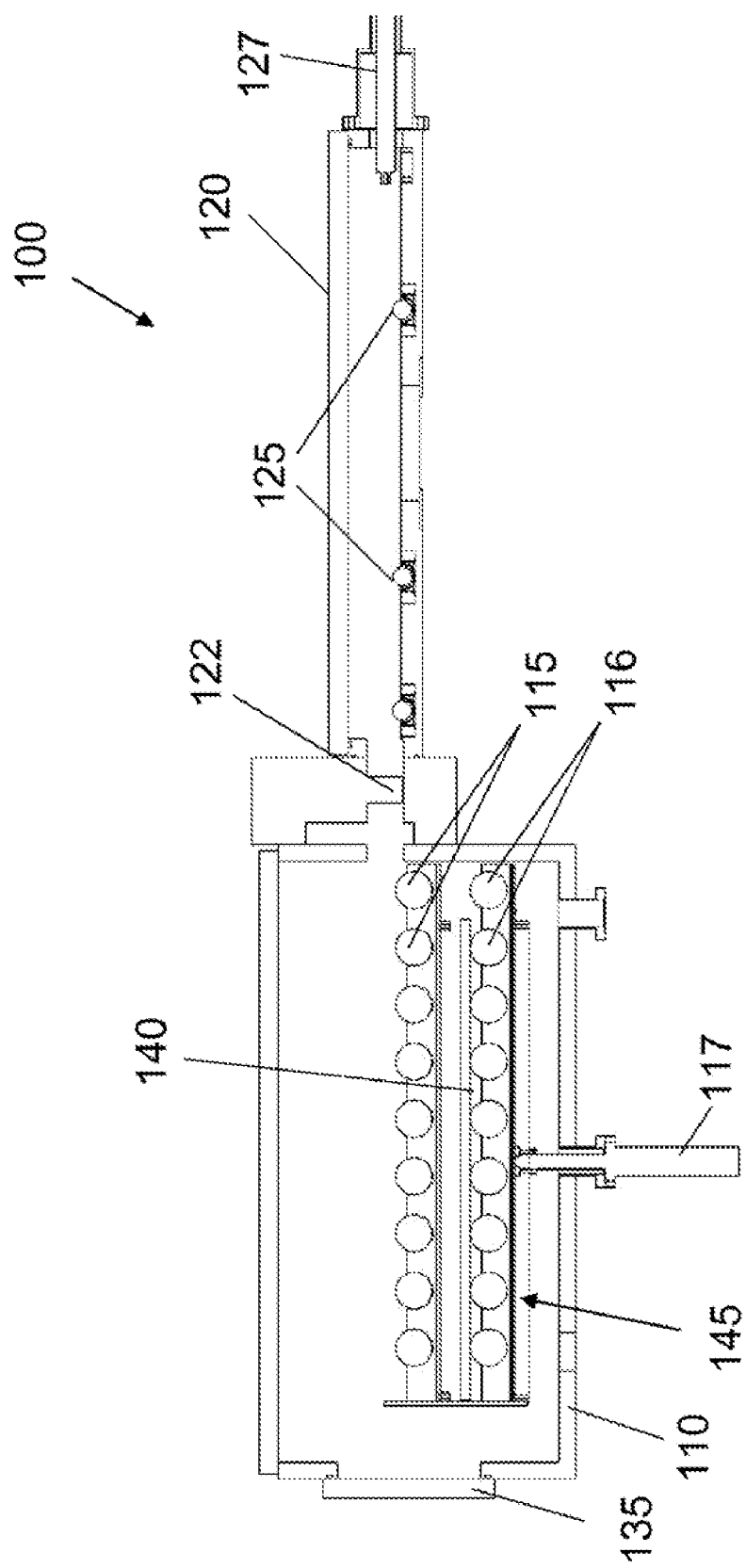
FIG. 1E is a side cross-sectional view of the substrate processing system of FIG. 1A illustrating the loading of a first substrate in the load lock.
Figure 1F:
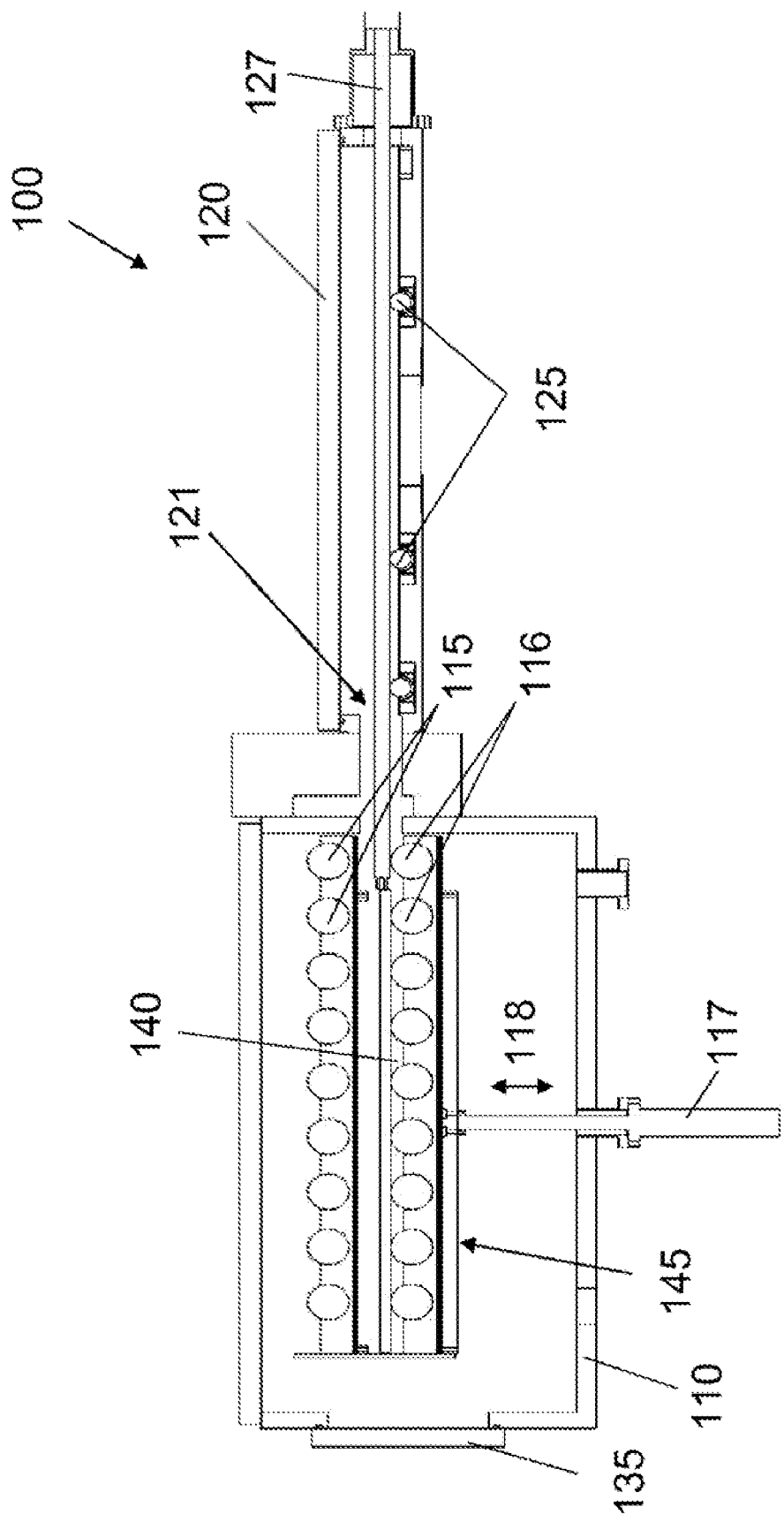
FIGS. 1F and 1G are side cross-sectional views of the substrate processing system of FIG. 1A illustrating the loading of the first substrate in the process chamber.
Figure 1G:
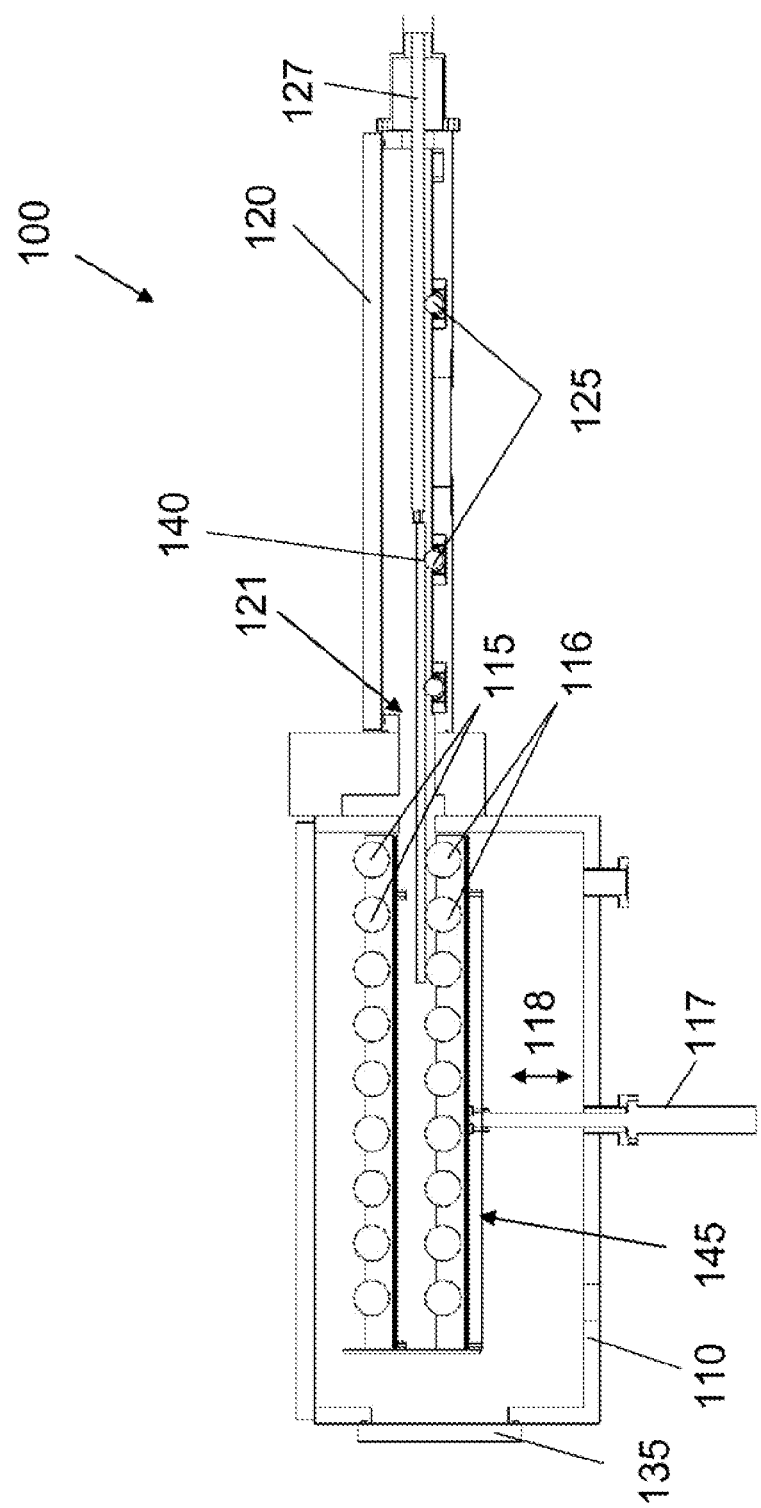

FIG. 1E shows that a substrate 140 has been loaded on the rollers 116 inside the load lock 110. The substrate 140 can be loaded through the opening 131 when the door 135 is open. The racking 145 on which the rollers 115 and 116 are mounted can be moved vertically by the transport mechanism 117 such that the top surfaces of the stack of rollers 116 are aligned to the inside of the opening 121 and to the rollers 125 in the process chamber 120. The isolation valve 122 is then opened to make the load lock 110 to be in the same vacuum environment as that of the process chamber 120. The substrate 140 is being pulled by the mechanism 127 from the load lock 110 into the process chamber 120, as shown in FIGS. 1F and 1G. The mechanism 127 can engage with the substrate 140 by a magnetic attractive force between a first magnet mounted at the tip of the mechanism 127 and another magnet of opposite polarity, or paramagnetic material such as 410 Stainless Steel mounted on a holder for the substrate 140. The low friction rolling motions of the rollers 125 and 116 allow smooth and low-resistance movement of the substrate 140 into the process chamber 120. The mechanism 127 can be driven by a low-power motor or manually by an operator. Many inexpensive commercial transportation mechanisms for vacuum systems can be used for the mechanism 127 from, for example, Transfer Engineering of Fremont, Calif. The substrate 140 is placed on the rollers 116.

Figure 1H:
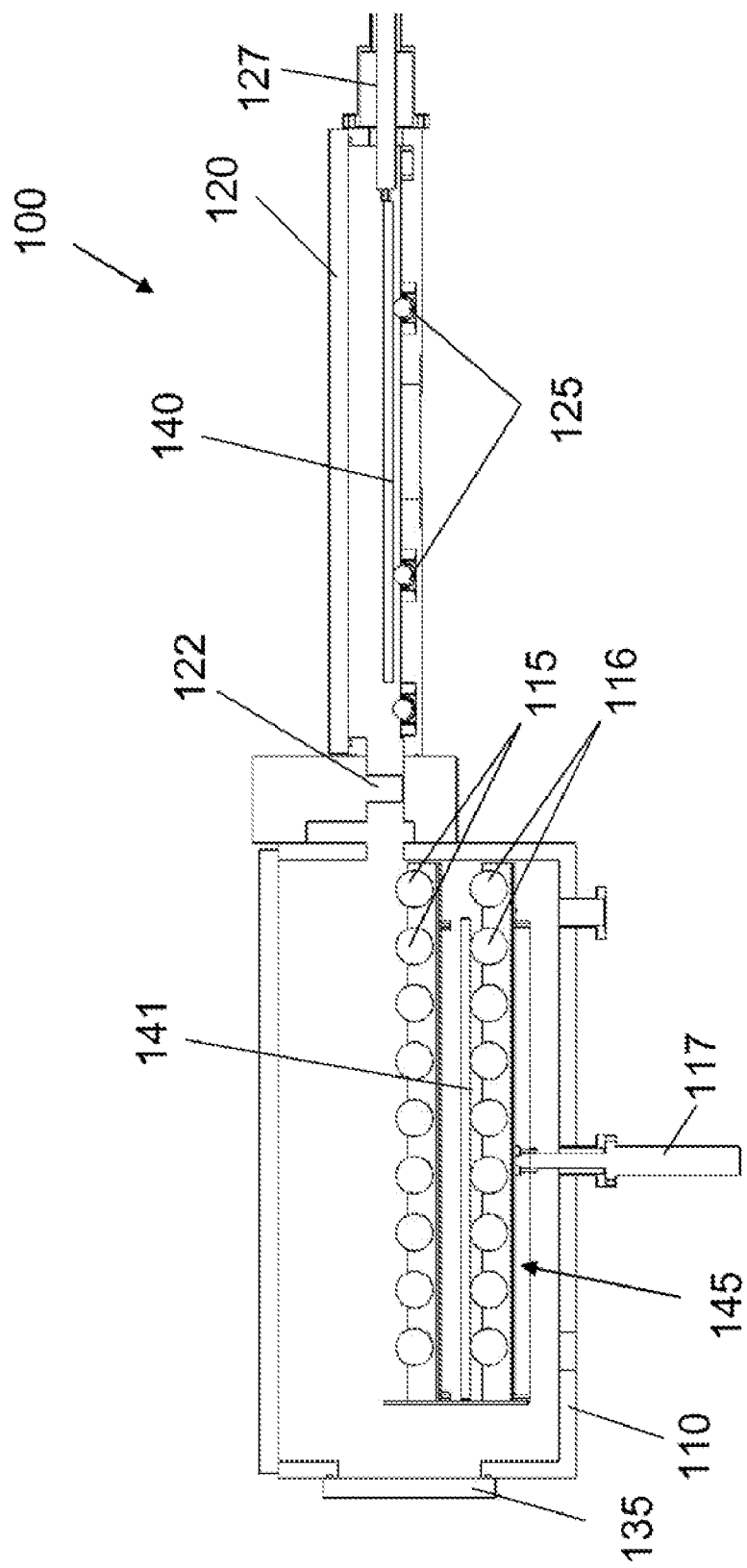
FIG. 1H is a side cross-sectional view of the substrate processing system of FIG. 1A showing that a second substrate is loaded in the load lock while the first substrate is in the process chamber.

After the mechanism 127 has placed the substrate 140 on the rollers 125 in the process chamber 120, as shown in FIG. 1H, the isolation valve 122 is closed. The substrate 140 is ready for processing such as cleaning and material depositions. A second substrate 141 can be loaded into the load lock 110 through the opening 131 while the substrate 140 can be processed in the isolated vacuum environment in the process chamber 120. After the second substrate 141 is placed on the rollers 116, the load lock 110 can be sealed and evacuated to a similar vacuum environment as that in the process chamber 120.

Figure 1I:
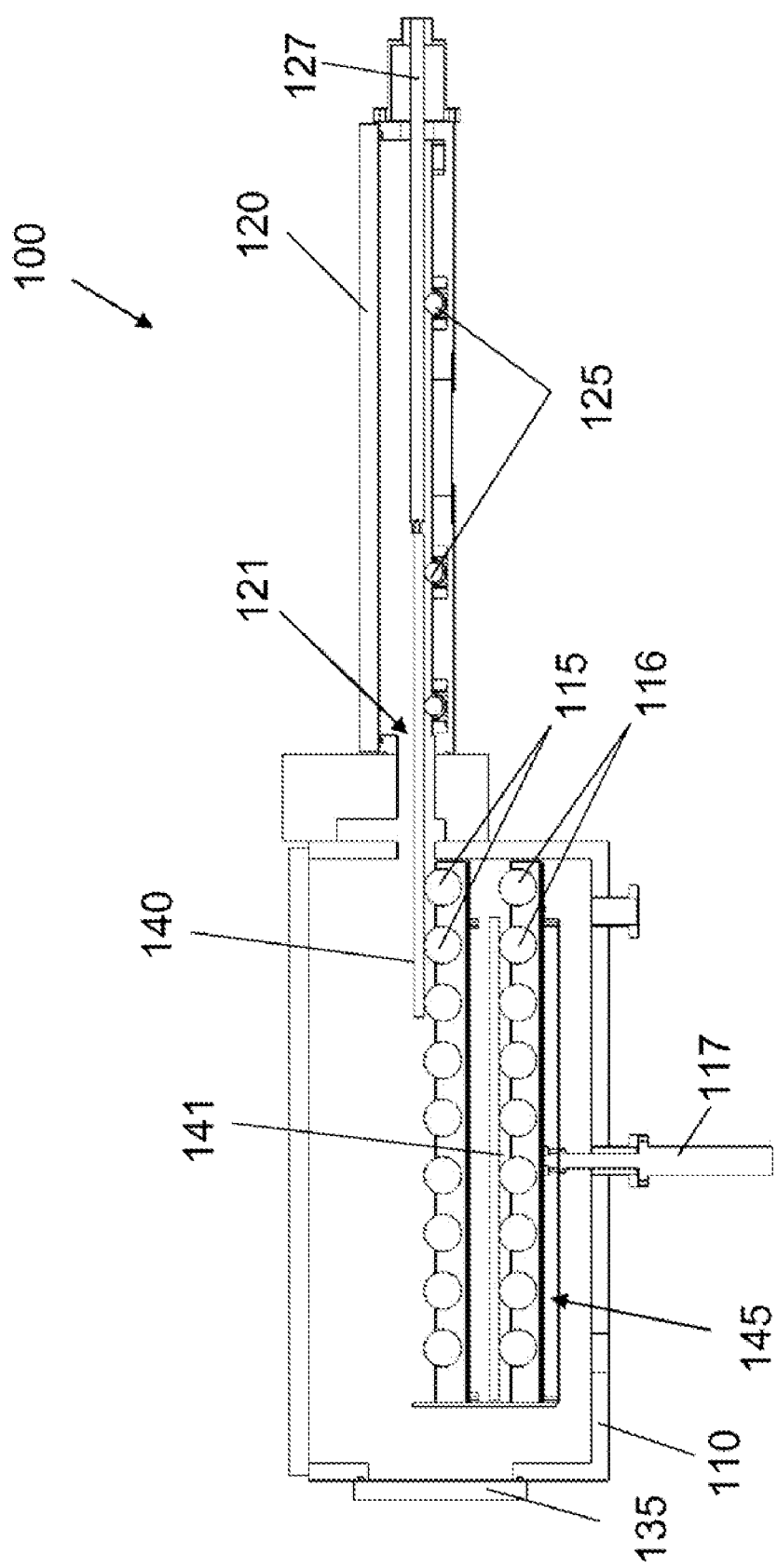
FIG. 1I is a side cross-sectional view of the substrate processing system of FIG. 1A showing that the removal of the first substrate from the process chamber.

After the processing of the substrate 140, the isolation valve 122 can be lifted. The substrate 140 can be pushed by the mechanism 127 on the rollers 125 and rollers 115. The substrate 140 is moved out of the process chamber 120 into the load lock 110 by the mechanism 127, as shown in FIG. 1I.

Figure 1J:
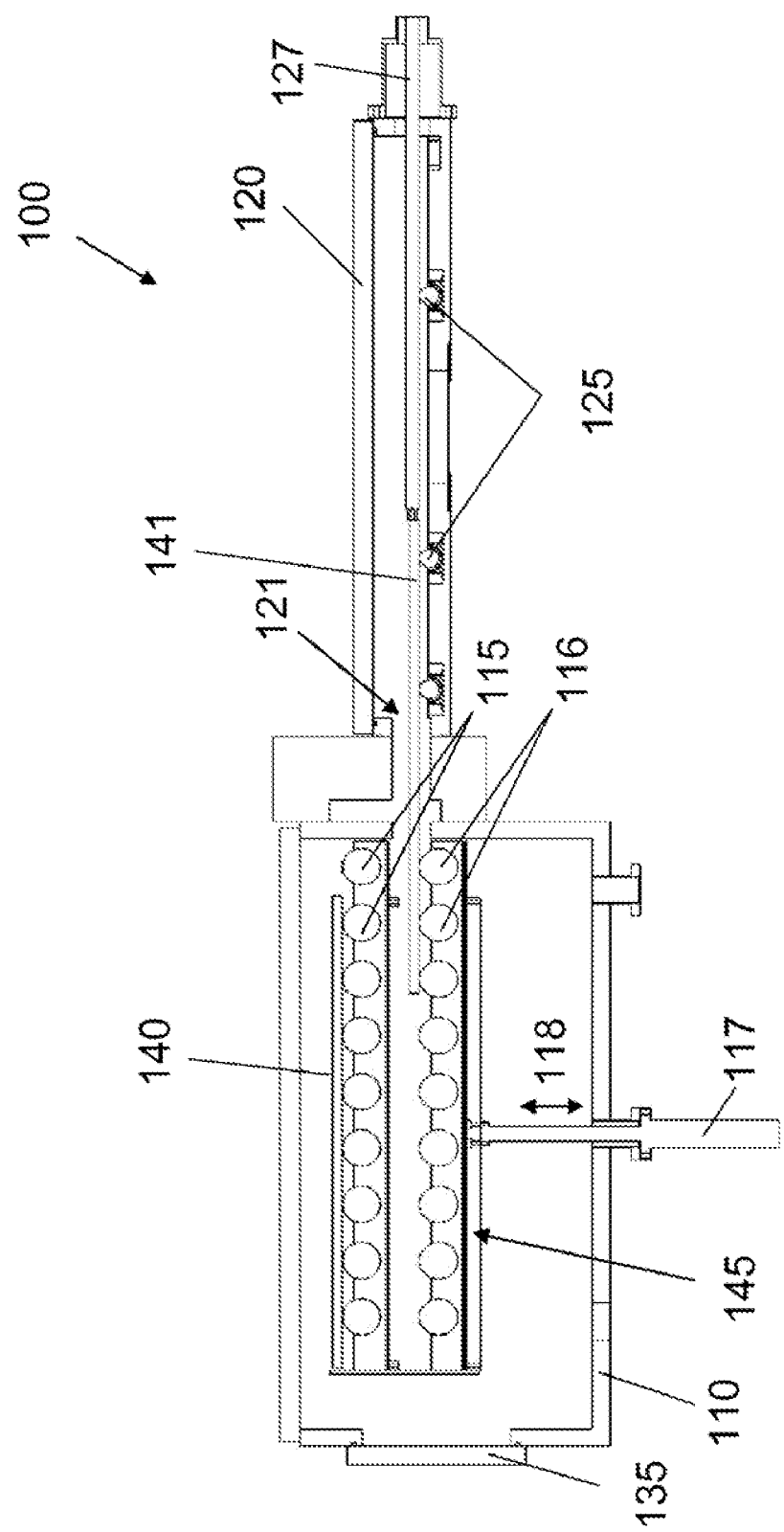
FIGS. 1J and 1K are side cross-sectional views of the substrate processing system of FIG. 1A illustrating the loading of a second substrate from the load lock into the process chamber.

After the substrate 141 is placed on the rollers 115, the rollers 115, 116 and the substrates 140, 141 on the rollers 115, 116 are moved upward by the mechanism 117 to align the second substrate 141 to the opening 121. The second substrate 141 can be pulled by the mechanism 127 from the load lock 110 into the process chamber 120, as shown in FIG. 1J. The pulling can be implemented by an attractive magnetic force between magnets that are mounted at the end of the mechanism 127 and on the edge of a holder for the substrate 140 (or 141). The pulling can also be implemented by mechanically engaging the mechanism 127 to the edge of a holder for the substrate 140 (or 141). The mechanism 127 can be disengaged from the substrate 140 (or 141) by pulling the mechanism 127 while holding the substrate or holder of the substrate against a mechanical stopper. The mechanism 127 from the substrate 140 (or 141) can be disengaged from the substrate 140 or 141 by a stronger magnetic force mounted either inside load lock 110 or mounted on the rack 145.

Figure 1K:
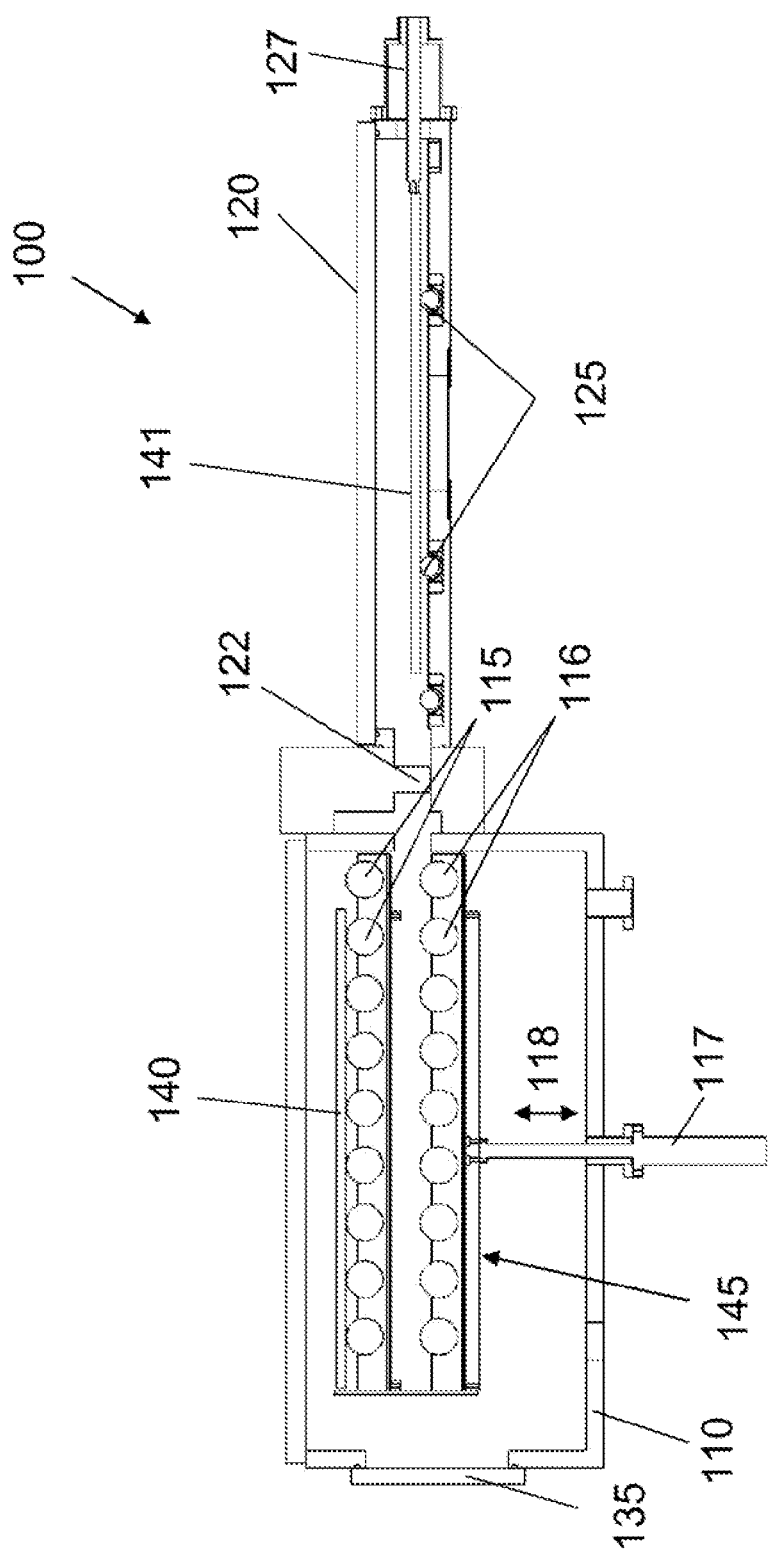

After the substrate 141 is placed on the rollers 125 in the process chamber 120, as shown in FIG. 1K, the isolation valve 122 can shut the opening 121. The substrate 141 is ready for processing such as material depositions in a vacuum environment. The substrate 140 can be unloaded from the load lock 110 and new substrates can be loaded into the load lock 110 through the opening 131. The steps illustrated in the FIGS. 1E to 1K can be repeated to process a large number of substrates. It should be noted that the substrate 140 or 141 can be formed by a single piece, or include multiple substrates placed or held on a carrier. It should also be noted that there can be more than two stacks of rollers in the load lock to achieve the effect.

It should be noted that the disclosed substrate processing system is compatible with a single load lock or a multiple of load locks. For example, the substrate processing system 100 can include a single load lock 110 that handles the loading and unloading of the substrates. The substrates in the load lock can be preheated in preparation for the processing in the process chamber 120. Furthermore, the load lock 110 can optionally include a source 151 that can allow certain process steps (e.g. deposition, cooling, etching) to be conducted in the load lock 110.

In some embodiments, the substrate processing system 100 can also include a second load lock in addition to the load lock 110. The second load lock can be positioned on the opposite side of the process chamber from the first load lock 110. The interior of the second load lock 130 connects to the interior of the process chamber 120 another opening in the process chamber. A separate isolation valve can open or shut the second opening. A transport mechanism can move substrates between the process chamber 120 and the two load locks. In some embodiments, the load lock 110, the process chamber 120, and the second load lock can be arranged as a continuous workflow. The load lock 110 can be assigned to load substrates into the process chamber 120. The second load lock can be responsible for unloading substrates from the process chamber 120. The loading and unloading of the substrates as well as the processing of the substrates in the process chamber can all be conducted in parallel. The throughput of the substrate processing system can be significantly improved. Similar to the load lock 110, the second load lock can include stacks of rollers that can hold and transport a multiple of substrates.

Figure 2:
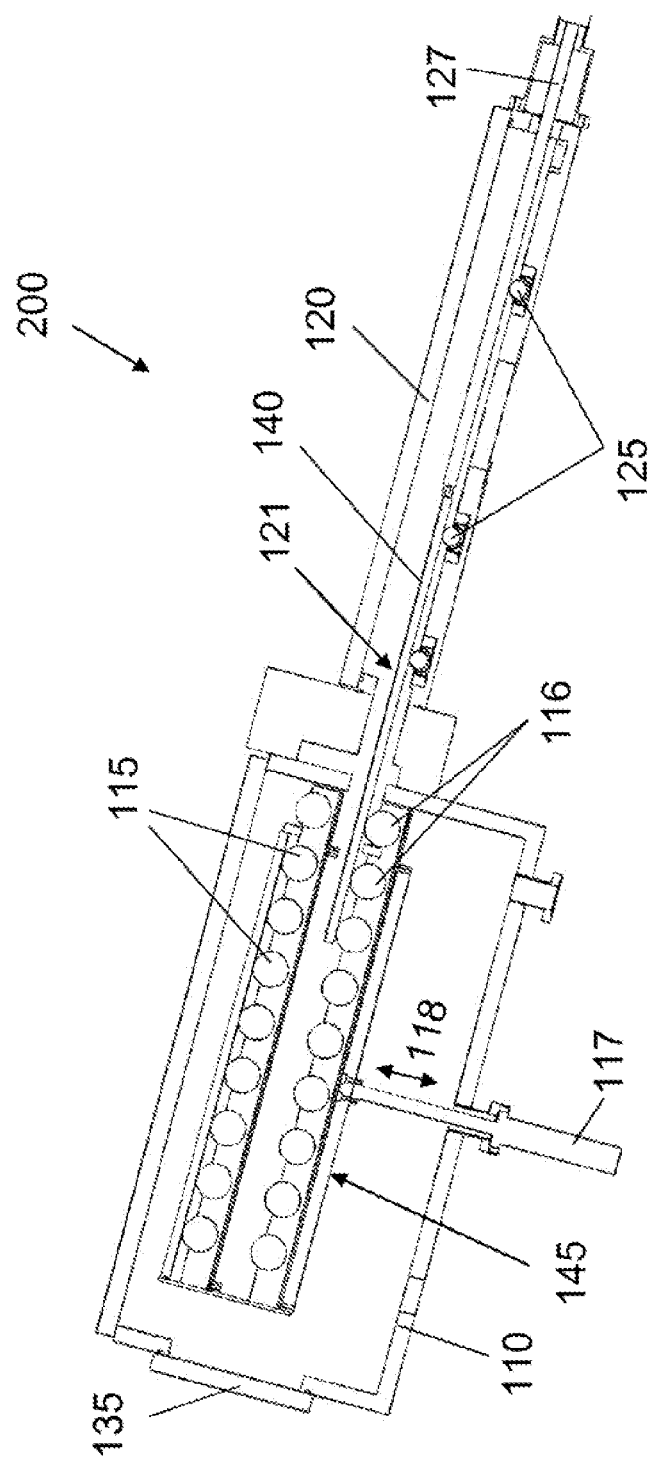
FIG. 2 is a cross-sectional view of another substrate processing system having an improved substrate transport system and a process chamber.

In some embodiments, the disclosed substrate processing system can be tilted to one direction to create a bias. For example, as shown in FIG. 2, the substrate processing system 200 can be tilted toward the process chamber 120. Because the gravitational force constantly pulls the substrate 140 toward the process chamber 120, the transport mechanism can push the substrate 140 left upward into the load lock 110. One or more stoppers can be included in the load lock 110 to hold the substrate 140 in place once the substrate is in the load lock 110. The mechanism 127 can be withdrawn from the process chamber 120 to allow the isolation valve 122 to shut and the substrate to receive processing steps. After processing of the substrate, the isolation valve 122 can open. The mechanism 127 can push the substrate out of the process chamber 120 and into the load lock 110.

Figure 3A:
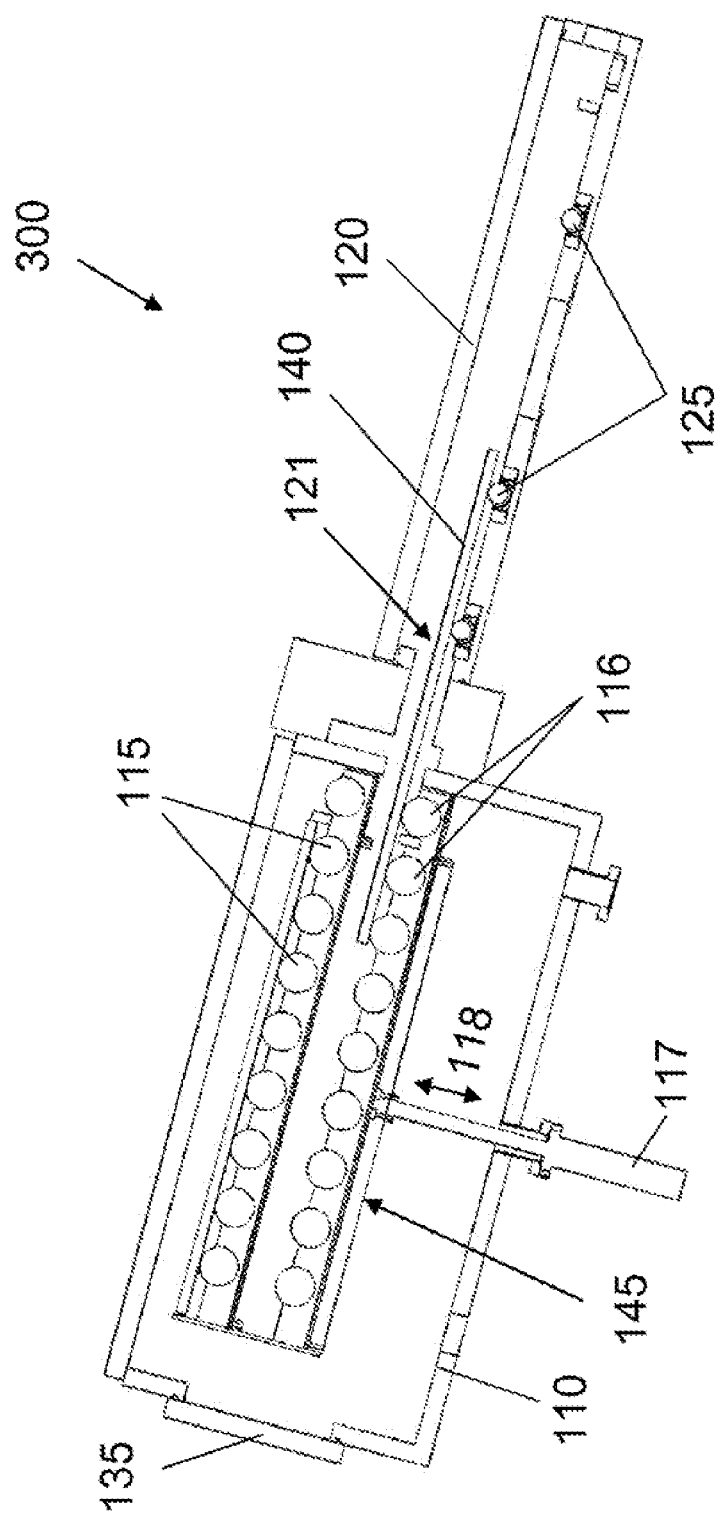
FIG. 3A is a cross-sectional view of another substrate processing system having an improved substrate transport system and a process chamber while the substrate processing system is tilted to one direction.
Figure 3B:
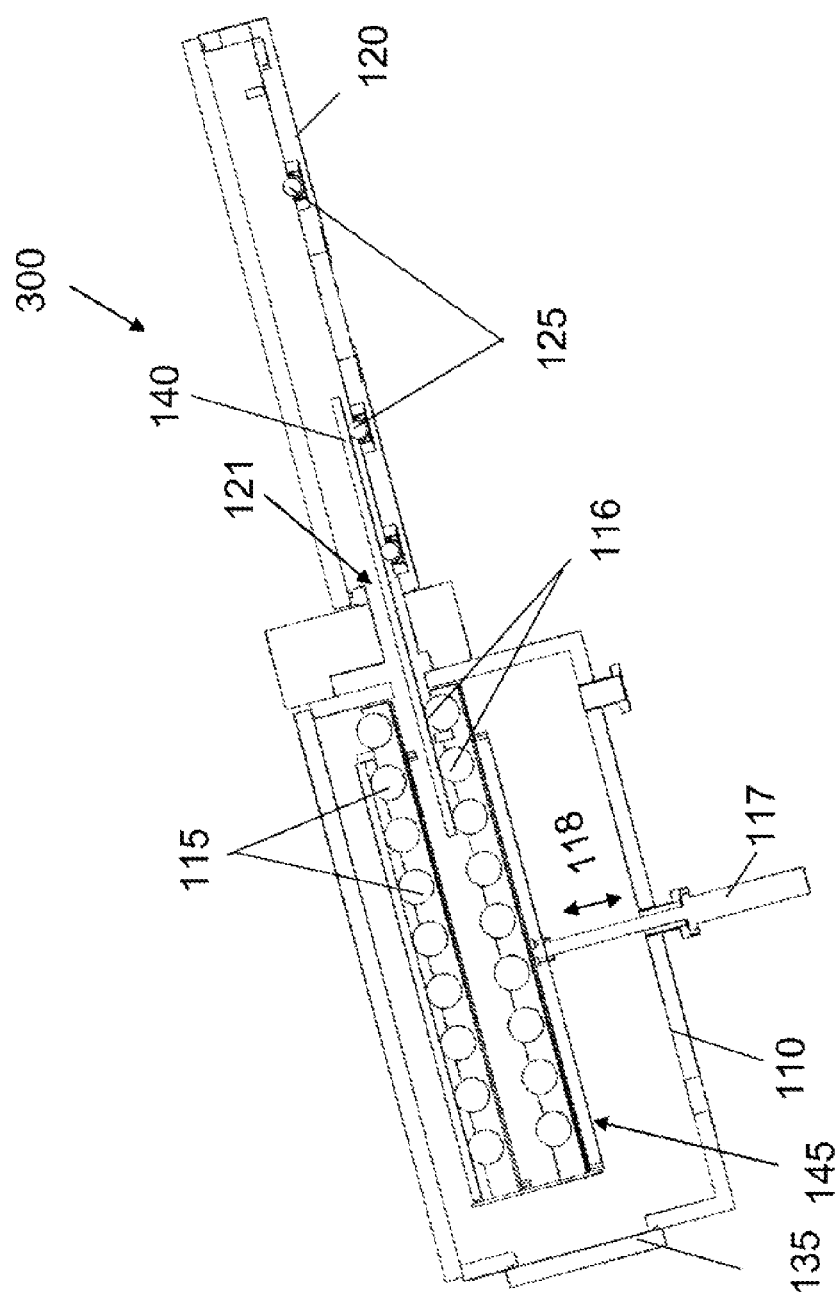
FIG. 3B is a cross-sectional view of the substrate processing system in FIG. 3A while the substrate processing system is tilted to another direction.

In some embodiments, the disclosed substrate processing system can be tilted to in a plurality of directions to move the substrates by gravitational force. For example, as shown in FIGS. 3A and 3B, the substrate processing system 300 can be tilted toward the load lock 110 (FIG. 3A), or away from the load lock 110 (FIG. 3B). The different tilt configurations of the substrate processing system 300 can move the substrate 140 between the process chamber 120 and the load lock 110. The substrate processing system 300 does not require a transport mechanism that directly pushes or pulls a substrate between the load lock 110 and the process chamber 120.

The tilt angles of the substrate processing systems 200 and 300 can be controlled within a range, for example, less than 33 degrees, or 30 degrees, or 25 degrees, or 20 degrees relative to the horizontal direction. In the present specification, the term "horizontal" is defined as a direction perpendicular to the gravity direction. The rollers in the disclosed substrate processing systems are not driven by active transport mechanism such as motors. They can be passively rotated by gravity or by the movement of the substrate sitting on top. The substrate can be moved by a mechanism 127 using either a motorized or a manual mechanism.

It is understood that the tilting of the disclosed substrate processing system is not limited to tilt movement around a single rotation axis. For example the disclosed substrate processing system can tilt around two rotation axes to move a substrate in two dimensions in the process chamber or a load lock. For example, the substrate can be reliably positioned in two, three, four, or more locations in the process chamber or the load locks. The multiple holding locations for the substrate in the process chamber can allow multiple substrates to be processed at different process station, including in parallel processing operations. The multiple holding locations for the substrate in the load locks allow multiple substrates to be loaded and unloaded from the substrate processing system.

Figure 4:
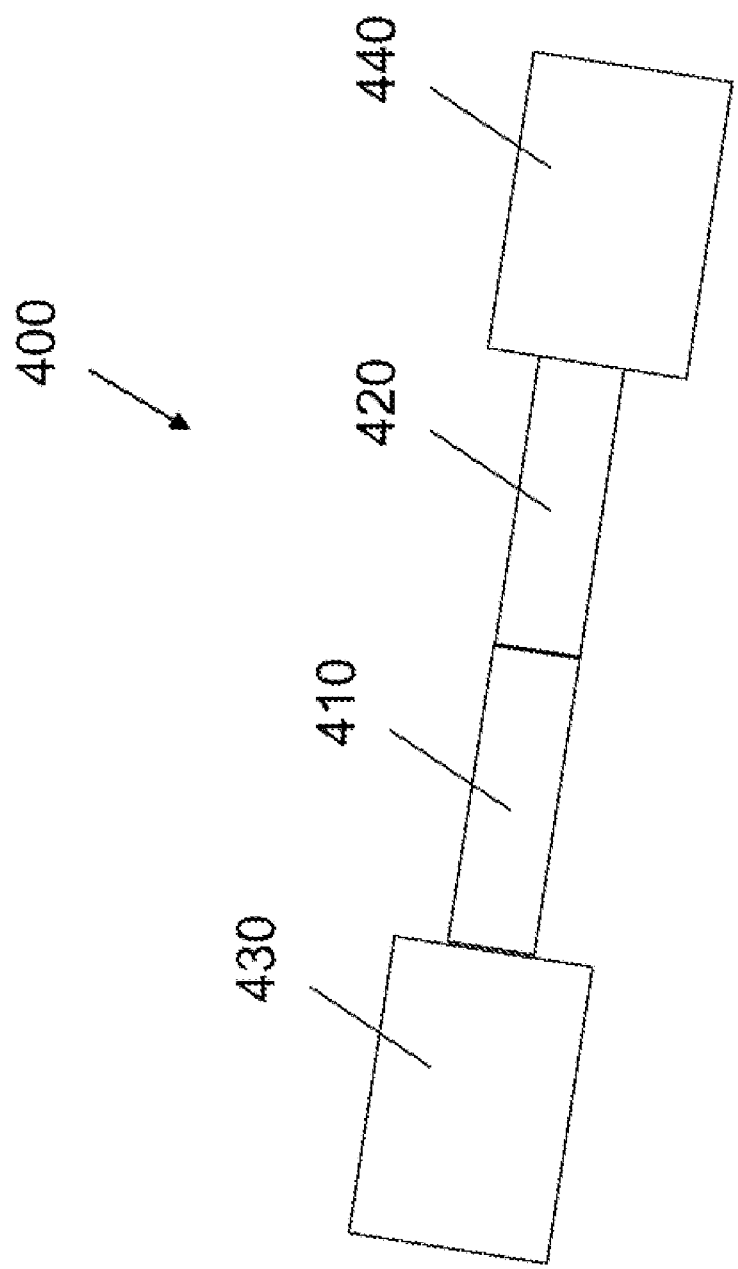
FIG. 4 is a cross-sectional view of another substrate processing system having an improved substrate transport system and a multiple of process chambers.

In some embodiments, the disclosed substrate processing system can include multiple process chambers. For example, as shown in FIG. 4, the substrate processing system 400 can have two or more interconnected a process chambers 410 and 420, and load locks 430 and 440 for loading and unloading substrates to and from the process chambers 410 and 420. The substrate processing system 400 can include a tilt as shown in FIG. 4, or operate substantially level as described in FIGS. 1A to 1K. The substrate processing system 400 can also tilt back and forth around one or more rotation axis to move the substrates among the process chambers 410, 420 and load locks 430, 440. Moreover, a continuous workflow can be set up from the load lock 430 to the load lock 440 through the multiple process stations provided by the process chambers 410, 420.

It is understood that the disclosed process chamber is compatible with many different types of processing operations such as physical vapor deposition (PVD), thermal evaporation, thermal sublimation, sputtering, chemical vapor deposition (CVD), plasma enhanced chemical vapor deposition (PECVD), ion etching, or sputter etching. It should also be noted that the load lock in the disclosed substrate processing system can include one, two, or more than two stacks of rollers, each of which can carry and transport one or more substrates.

What is claimed is:

1. A substrate processing system, comprising:
    a first load lock;
    a process chamber having a first opening to allow an exchange of a substrate between the first load lock and the first process chamber, wherein the first load lock is fixed to the process chamber throughout operation;
    first rollers in the process chamber;
    second rollers in the first load lock;
    a first transport mechanism configured to move the second rollers in translational movements relative to the first load lock, wherein the first rollers and the second rollers are configured to transport a substrate thereon through the first opening between the first load lock and the process chamber, wherein the first rollers and the second rollers are idler rollers; and
    wherein at least one of the first load lock and the process chamber is configured to tilt to a first tilt angle to allow the substrate to move under gravitation on the first rollers and the second rollers from the first load lock to the process chamber, and wherein at least one of the first load lock and the process chamber is configured to tilt to a second tilt angle to allow the substrate to move under gravitation on the first rollers and the second rollers from the process chamber to the first load lock.

2. The substrate processing system of claim 1, wherein the first rollers and the second rollers are configured to transport the substrate substantially within a plane.

3. The substrate processing system of claim 1, wherein the second rollers comprise a first stack of second rollers and a second stack of second rollers at a different height from the first stack of rollers.

4. The substrate processing system of claim 3, wherein the first transport mechanism is configured to move the first stack of second rollers in translational movements relative to the first load lock, wherein the first rollers and the first stack of second rollers are configured to transport the substrate substantially through the first opening between the first load lock and the process chamber.

5. The substrate processing system of claim 4, wherein the first transport mechanism is configured to move the second stack of rollers to substantially the same height as the first rollers, and wherein the first rollers and the second stack of rollers are configured transport the substrate substantially through the first opening between the first load lock and the process chamber.

6. The substrate processing system of claim 1, further comprising a second transport mechanism configured to move the substrate on the first rollers and the second rollers.

7. The substrate processing system of claim 1, wherein at least one of the first load lock and the process chamber is configured to tilt to allow the substrate to move under gravitation on the first rollers and the second rollers, wherein the tilt angle is below 25 degrees relative to the horizontal direction.

8. The substrate processing system of claim 7, wherein the tilt angle is below 20 degrees relative to the horizontal direction.

9. The substrate processing system of claim 8, wherein the tilt angle is between 1 and 10 degrees relative to the horizontal direction.

10. The substrate processing system of claim 1, wherein the process chamber comprises at least one deposition source configured to provide a material to be deposited on the substrate.

11. The substrate processing system of claim 1, wherein the first load lock comprises at least one deposition source configured to provide a material to be deposited on the substrate.

12. The substrate processing system of claim 1, further comprising a gate configured to close the first opening to isolate the interior of the first process chamber from the interior of the first load lock.

13. The substrate processing system of claim 1, wherein the first load lock comprises an opening through which the substrate is loaded into the first load lock therein or unloaded from the first load lock therein.

14. The substrate processing system of claim 1, further comprising:
a second load lock configured to connect with the process chamber through a second opening in the chamber wall; and
third rollers in the second load lock, wherein the second rollers and the third rollers are configured to transport a substrate thereon through the second opening between the second load lock and the process chamber.

15. The substrate processing system of claim 14, wherein the first load lock and the second load lock are disposed on opposite sides of the process chamber.

16. The substrate processing system of claim 14, wherein the second rollers comprise a first stack of rollers and a second stack of rollers at a different height from the first stack of rollers.

17. The substrate processing system of claim 14, wherein the first load lock, the process chamber, and the second load lock are configured to tilt to allow the substrate to move under gravitation on at least one of the first rollers, the second rollers, and the third rollers.

18. A substrate processing system, comprising:
a first load lock;
a process chamber having a first opening to allow an exchange of a substrate between the first load lock and the first process chamber, wherein the first load lock is fixed to the process chamber throughout operation;
first rollers in the process chamber; a first stack of second rollers in the first load lock;
a second stack of second rollers in the first load lock, wherein the second stack of second rollers are at a different height from the first stack of rollers, wherein the first rollers and the first stack of the second rollers are configured to transport a first substrate thereon through the first opening between the first load lock and the process chamber, and wherein the first rollers and the second stack of the second rollers are configured to transport a second substrate thereon through the first opening between the first load lock and the process chamber;
a first transport mechanism configured to move the first stack of second rollers and the second stack of second rollers relative to the first load lock, wherein the first transport mechanism is configured to move the first stack of second rollers and the second stack of second rollers in translational movements relative to the first load lock; and
wherein at least one of the first load lock and the process chamber is configured to tilt to allow the substrate to move under gravitation on at least one of the first rollers and the second rollers.

19. The substrate processing system of claim 18, further comprising a second transport mechanism configured to move the substrate on the first rollers and the second rollers, wherein the first rollers, the first stack of second rollers, and the second stack of the second rollers are idler rollers.

20. The substrate processing system of claim 18, further comprising:
a second load lock configured to connect with the process chamber through a second opening in the chamber wall; and
third rollers in the second load lock, wherein the second rollers and the third rollers are configured to transport a substrate thereon through the second opening between the second load lock and the process chamber.

21. A substrate processing system, comprising:
a first load lock;
a first process chamber having a first opening to allow an exchange of a substrate between the first load lock and the first process chamber, wherein the first load lock is fixed to the process chamber throughout operation;
a second process chamber having a second opening to allow an exchange of the substrate between the first process chamber and the second process chamber;
a second load lock having a second opening to allow an exchange of the substrate between the second load lock and the second process chamber;
first rollers in the first load lock, wherein the first rollers are configured to be moved in translational movements relative to the first load lock;
second roller in the first process chamber, wherein the first rollers and the second rollers are configured to transport the substrate thereon through the first opening between the first load lock and the first process chamber;
third roller in the second process chamber, wherein the second rollers and the third rollers are configured to transport the substrate thereon through the second opening between the first process chamber and the second process chamber;

fourth rollers in the second load lock, wherein the third rollers and the fourth rollers are configured to transport the substrate thereon through the third opening between the second process chamber and the second load lock, wherein the first rollers, the second rollers, the third rollers, and the fourth rollers are idler rollers; and wherein the first load lock, the first process chamber, the second process chamber, and the second load lock are configured to tilt to allow the substrate to move under gravitation on at least one of the first rollers, the second rollers, the third rollers, and the fourth rollers.

22. The substrate processing system of claim 21, wherein the first rollers comprise a first stack of first rollers and a second stack of first rollers at a different height from the first stack of rollers.

* * * * *